US 6,616,106 B1

(12) United States Patent
Dean et al.

(10) Patent No.: US 6,616,106 B1
(45) Date of Patent: Sep. 9, 2003

(54) SYSTEM AND MEANS FOR THE SECURE MOUNTING OF A DEVICE BRACKET (75) Inventors: Ronald Paul Dean, Fort Collins, CO (US); Kristina Lynn Mann, Fort Collins, CO (US); Sean William Tucker, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/080,189

(22) Filed: Feb. 21, 2002

(51) Int. Cl.[7] ................................................ G12B 9/00
(52) U.S. Cl. .................. 248/27.1; 248/298.1; 361/685; 361/726
(58) Field of Search .............................. 248/27.1, 27.3, 248/298.1, 346.03; 361/685, 726, 683, 725, 727

(56) References Cited

U.S. PATENT DOCUMENTS

| | | | |
|---|---|---|---|
| 4,682,833 A | | 7/1987 | Ferchau et al. |
| 4,881,295 A | * | 11/1989 | Odemer ........................ 16/422 |
| 4,947,661 A | * | 8/1990 | Yoshida ...................... 248/27.1 |
| 5,073,978 A | * | 12/1991 | Mastrippolito ............. 248/27.1 |
| 5,077,722 A | | 12/1991 | Geist et al. |
| 5,211,459 A | * | 5/1993 | Wu ............................... 211/26 |
| 5,262,923 A | * | 11/1993 | Batta et al. .................. 312/333 |
| 5,340,340 A | | 8/1994 | Hastings et al. |
| 5,510,955 A | * | 4/1996 | Taesang ..................... 361/683 |
| 5,560,572 A | * | 10/1996 | Osborn et al. ............... 248/201 |
| 5,654,873 A | | 8/1997 | Smithson et al. |
| 5,682,291 A | * | 10/1997 | Jeffries et al. ............. 312/223.2 |
| 5,683,159 A | * | 11/1997 | Johnson ..................... 312/223.2 |
| 5,765,933 A | | 6/1998 | Paul et al. |
| 5,779,197 A | * | 7/1998 | Kim ........................... 248/27.1 |
| 5,791,753 A | | 8/1998 | Paquin |
| 5,823,495 A | * | 10/1998 | Joss et al. ................... 248/27.1 |
| 5,828,547 A | * | 10/1998 | Francovich et al. ......... 361/685 |
| 6,067,225 A | | 5/2000 | Reznikov et al. |
| 6,227,631 B1 | | 5/2001 | Lin et al. |
| 6,318,679 B1 | * | 11/2001 | Yang et al. ................. 248/201 |
| 6,402,288 B2 | * | 6/2002 | Rhodes et al. ................ 347/29 |
| 6,404,641 B1 | * | 6/2002 | Fisk et al. ................. 312/332.1 |
| 2002/0066832 A1 | * | 6/2002 | Kwon ........................ 248/27.3 |

OTHER PUBLICATIONS

U.S. patent application Ser. No. 09/430,333, Roesner et al., filed Nov. 19, 1999.
U.S. patent application Ser. No. 10/080,341, Dean et al., filed Feb. 21, 2002.

* cited by examiner

Primary Examiner—Leslie A. Braun
Assistant Examiner—A. Joseph Wujcink (57) ABSTRACT

The present invention relates to a bracket system for mounting a device bracket within an assembly comprising a plurality of chassis brackets, a mounting bracket assembly and a chassis base with a plurality of tabs. The chassis brackets have slots and the brackets are attached to the chassis base of the assembly. The mounting bracket assembly has a plurality of tapered mounting bracket assembly slots, and a plurality of horizontally-protruding pegs.

18 Claims, 6 Drawing Sheets

SYSTEM AND MEANS FOR THE SECURE MOUNTING OF A DEVICE BRACKET

RELATED APPLICATIONS

The present invention is related to commonly-assigned, concurrently-filed, U.S. patent application Ser. No. 10/080,341, entitled "DEFORMABLE MOUNTING BRACKET," the disclosure of which is hereby incorporated herein by reference in its entirety.

TECHNICAL FIELD

The present invention is generally related to mounting brackets and more specifically related to the secure mounting of a device bracket.

BACKGROUND

Modular components or devices are typically mounted within an assembly by first mounting the device to a metal bracket and then installing the bracket with the mounted device into corresponding rails, tabs or other mating elements in an assembly chassis or cabinet. Such components or devices include electronic equipment, components or hardware that is mounted in an equipment rack or other assembly; and hard drives, tape drives, memory devices, electronic media drives and other computer hardware that are mounted in a computer assembly or chassis. A common method of mounting devices uses plastic brackets that snap onto the device. The brackets are then aligned with sheet metal tabs on the chassis. Once the device is fastened to the chassis, it can be electrically connected to the computer via a cable system or by directly mating a connector on the device with a matching connector within the computer assembly.

Both of these methods suffer from manufacturing tolerance problems. Sheet metal parts that are manufactured into a bracket shape must mate precisely with a sheet metal chassis assembly. Variations in the manufacturing tolerances of the bracket and of the chassis assembly can result in an undesirable loose fit between bracket and chassis, subjecting the mounted device to physical stresses and failure. Plastic bracketing also suffers from a similar tolerance problem caused by variations in the injection-molding process used for plastics manufacturing. These tolerance problems can cause the mounted device to come loose during shipping or operation if the bracket fits too loosely to the chassis. Electrical connections may fail as a result of these loose connections. Furthermore, a loosely-connected device is more easily damaged by shock or by vibration during transport than is a device tightly mounted to the chassis.

Bracketing systems usually do not provide a positive stop or other means for limiting the travel of an inserted device in the direction of insertion. Any positive stop provided by these brackets is usually due to the mating of the device connector with the computer assembly connector. A device bracket that uses a computer assembly connector as a positive stop places unwanted force upon that connector that can cause connector failure.

Devices can be directly attached to the chassis of a computer assembly without the use of a bracket. This technique requires the use of cabling to attach the device connector to the computer assembly connector, and does not work well for direct plug connection techniques that do not utilize cabling.

SUMMARY OF THE INVENTION

According to an embodiment of the present invention, a bracket system for mounting a device bracket within an assembly comprises a plurality of chassis brackets, a mounting bracket assembly and a chassis base with a plurality of tabs. The chassis brackets have slots and the chassis brackets are attached to the chassis base of the assembly. The mounting bracket assembly has a plurality of tapered mounting bracket assembly slots, and a plurality of horizontally-protruding pegs.

According to another embodiment of the present invention a device mounting system comprises a chassis base including at least one vertical tab orientated in a lateral direction, a pair of parallel chassis brackets attached to the chassis base, each of the chassis brackets including at least one slotted opening in a vertical portion of the chassis brackets, and a mounting bracket assembly including a floor and a pair of opposing side walls, the floor including at least one tapered mounting bracket assembly slot that engages the vertical tab, each of the opposing side walls including at least one horizontally-protruding peg configured to engage the slotted opening in the chassis bracket.

According to a further embodiment of the present invention a bracket system for securing a subassembly to a chassis comprises means for vertical alignment of the subassembly, the vertical alignment means also providing means for positive stop for the subassembly, means for horizontal alignment of the subassembly, the horizontal alignment means also providing means for positive stop for the subassembly, and means for securing the subassembly to the chassis.

DETAILED DESCRIPTION

Figure 1:
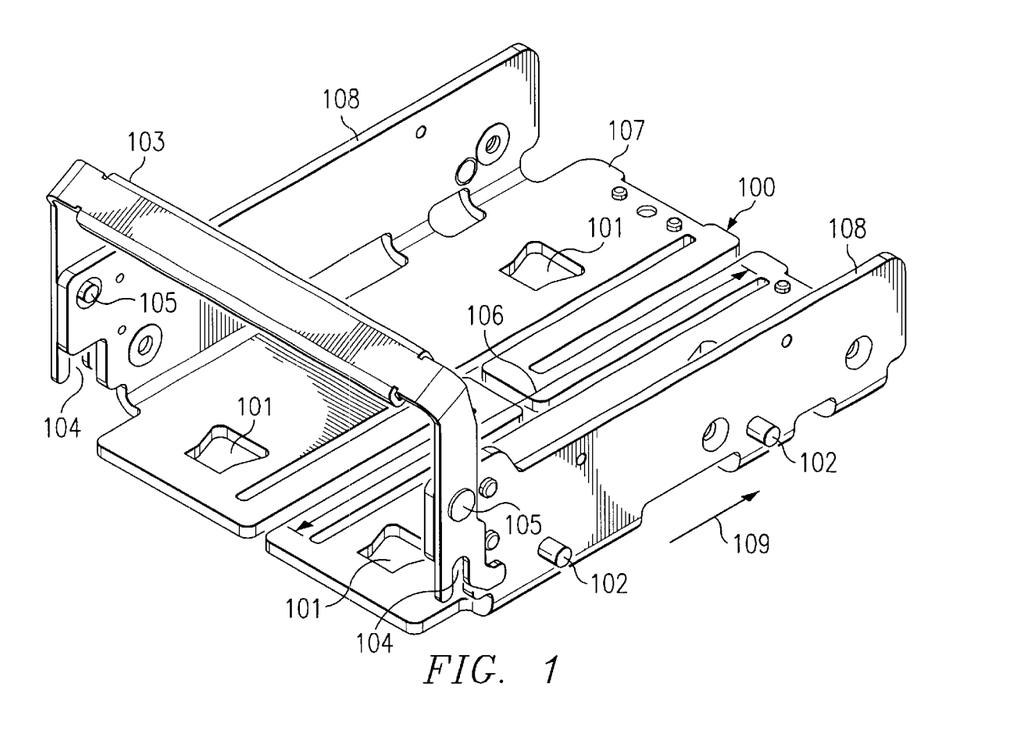
FIG. 1 is a perspective view of a mounting bracket assembly in accordance with one embodiment of the claimed invention.

The present invention is a system for the secure mounting of a device bracket within an assembly wherein the system may include a removable tray or drawer portion and a base mount assembly. FIG. 1 is a perspective view of mounting bracket assembly 100 in accordance with an embodiment of the invention. The mounting bracket assembly may be formed as a flat floor or bottom piece with opposing sidewalls, the front and back of the assembly being open. For purposes of describing this embodiment of the invention, back 107 of mounting bracket assembly 100 leads mounting bracket 100 in the direction of insertion of arrow 109, while the front of mounting bracket assembly 100 is on the opposite side of mounting bracket 100 from the back.

Mounting bracket assembly 100 incorporates mounting bracket slots 101 that are located in four positions in the bottom piece of mounting bracket assembly 100. Note that the present invention is not limited to four mounting bracket slots 101, and that a different number, arrangement, and/or orientation of mounting bracket slots 101 may be used. In this embodiment, four horizontally-protruding mounting bracket pegs 102 are used to hold mounting bracket assembly 100 in a specific vertical alignment when mounting bracket assembly 100 is slidably inserted into a computer assembly. In another embodiment, a different number of mounting bracket pegs 102 may be used. A handle 103 may be attached by rotatable rivets 105 to the sidewalls 108 near the front of the mounting bracket assembly 100. Mounting bracket assembly 100 may also be referred to here as a subassembly.

Insertion of mounting bracket assembly 100 is facilitated by mounting bracket handle 103. Mounting bracket handle 103 may be rotated to facilitate insertion of mounting bracket assembly 100, thereby sliding mounting bracket assembly 100 into a mating base mounted bracket. The mounting bracket assembly 100 may then be locked or fastened to the bracket. When mounting bracket handle 103 is rotated in mounting bracket assembly 100 insertion direction, mounting bracket handle slots 104 engage rotation pegs 205 on chassis brackets 203 illustrated in FIG. 2. Engagement of rotation pegs 205 by mounting bracket handle slots 104 locks mounting bracket assembly 100 into chassis brackets 203. Contact between mounting bracket handle slots 104 and rotation pegs 205 also locks mounting bracket assembly 100 in place, preventing mounting bracket assembly 100 from moving once mounting bracket handle 103 is preferably fully, rearwardly rotated. Mounting bracket handle 103 is fastened to mounting bracket assembly 100 with rivets 105 that allow forward or rearward rotation of mounting bracket handle 103. In other embodiments different methods of fastening mounting bracket handle 103 to mounting bracket assembly 100 may be utilized, such as methods using bolts or pegs of metal, plastic, or other materials. The embodiment of FIG. 1 also includes a deformable base conduction bracket 106. Conduction bracket 106 is used to ensure the easy installation and snug capture of a device by mounting bracket assembly 100. This design is described in detail in commonly-assigned U.S. patent application Attorney Docket No. 10017961-1, entitled "Deformable Mounting Bracket," filed concurrently herewith. Conduction bracket 106 is optional in other embodiments of the present invention.

Figure 2:
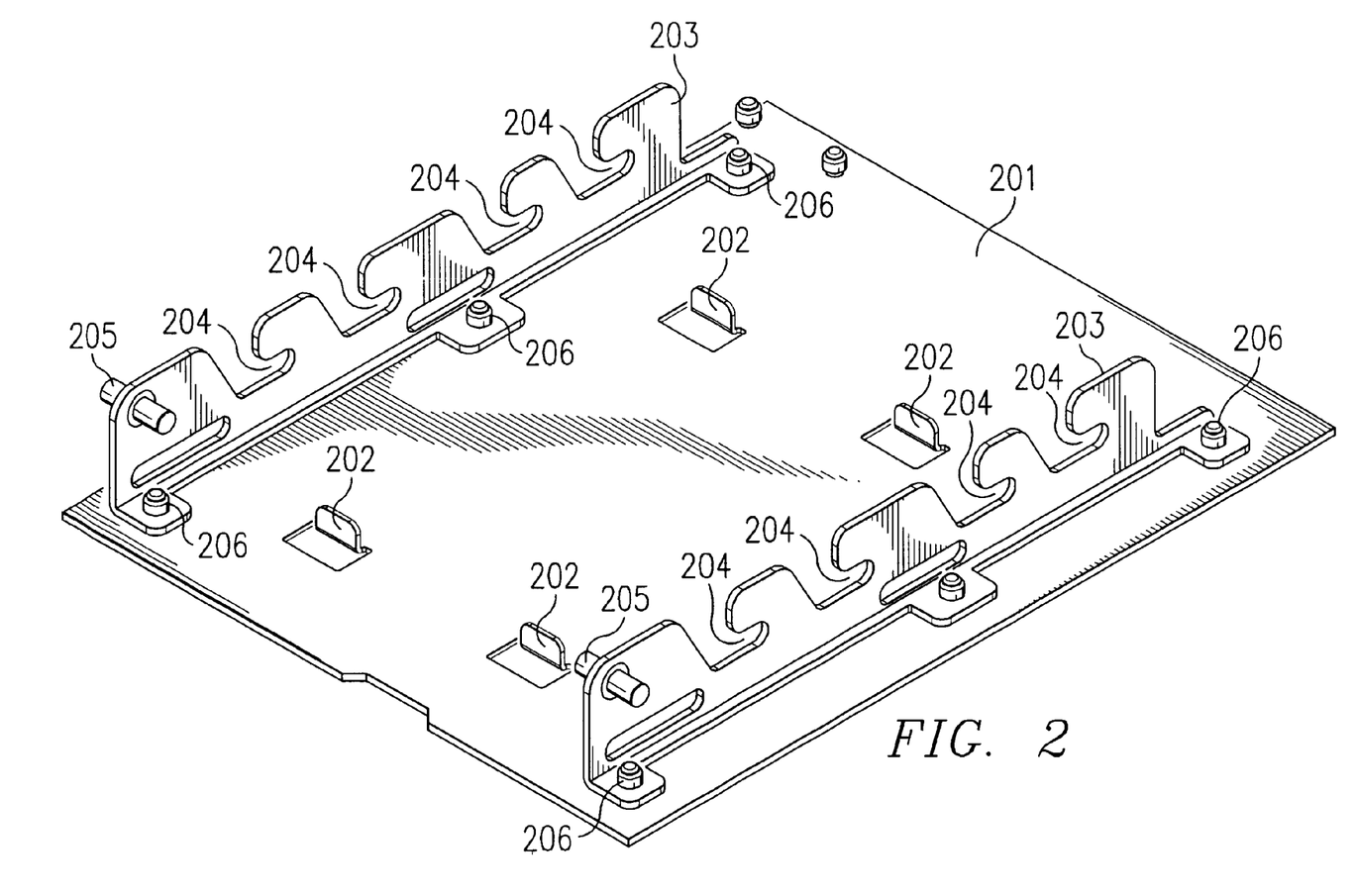
FIG. 2 is a perspective view of a chassis bracket assembly showing two chassis brackets in one configuration of the claimed invention.

FIG. 2 is a perspective view of computer assembly chassis base 201. Computer assembly chassis base 201 incorporates four vertical, laterally-oriented tabs 202 that are cut from chassis base 201 and bent vertically so they are perpendicular or nearly perpendicular to chassis base 201. Other embodiments may use a different number of tabs 202 or may use tabs 202 that are fastened to chassis base 201 or not manufactured from chassis base 201 itself. Tabs 202 may also be replaced with pins or similar features with mating slot details and remain within the current invention.

Tabs 202 are located on chassis base 201 between two chassis bracket assemblies 203. Chassis bracket assemblies 203 are parallel to each other and are oriented in the direction of insertion for a mounting bracket assembly, such as assembly 100 illustrated in FIG. 1. In a preferred embodiment, each chassis bracket 203 is composed of a sheet metal piece folded such that the metal to one side of the fold is perpendicular or nearly perpendicular to the plane of the piece located on the other side of the fold. In other embodiments, chassis bracket 203 may be composed of a material other than sheet metal. In one embodiment, each chassis bracket 203 is nearly identical, which reduces the cost of manufacturing. In other embodiments, chassis brackets 203 may not be nearly identical.

Each chassis bracket 203 profile contains four chassis bracket slots 204 that are cut from the piece of sheet metal on only one side of the chassis bracket fold. The profile view of chassis brackets 203 shows chassis bracket slots 204 are horizontal and parallel to chassis base 201 with a roughly vertical opening perpendicular to chassis base 201 allowing slidable insertion of mounting bracket pegs 102. The four chassis bracket slots 204, as shown, may provide support for two devices one on each side of chassis bracket 203. This arrangement preferably allows the number of chassis brackets required to be one more than the number of devices installed so for a two device arrangement, three chassis brackets would be required. In other embodiments, the number and shape of chassis bracket slots 204 may be different. Chassis bracket slots 204 are cut to allow the slidable insertion, engagement, and capture of the mounting bracket pegs 102 depicted in FIG. 1.

Each chassis bracket 203 also has one rotation peg 205 located close to a front end of chassis bracket 203 mounted or formed in side wall and extending parallel to the plane of chassis base 201. Each rotation peg 205 extends through chassis bracket 203, such that an approximately equal length of rotation peg 205 extends to either side of chassis bracket 203. In other configurations, rotation peg 205 may extend to only one side of chassis bracket 203. When mounting bracket handle 103 referred to in FIG. 1 is rearwardly rotated, mounting bracket handle 103 engages rotation pegs 205 of the chassis brackets 203, inserting mounting bracket assembly 100 into chassis brackets 203 and securing mounting bracket assembly 100 tightly. Mounting bracket handle 100 is held in a rearward position by the engagement of rotation pegs 205 with mounting bracket handle slots 104 and/or by the engagement of chassis brackets 203 with mounting bracket assembly 100. The positions of mounting bracket assembly 100 and chassis brackets 203 before and after mounting bracket handle 103 rotation are better shown in FIGS. 3A, 3B, 4A, and 4B.

In the one embodiment, each chassis bracket 203 is fastened to chassis base 201 with three rivets 206. In other embodiments, chassis brackets 203 may be fastened to chassis base 201 with a different number of rivets, or may be fastened using a method other than riveting, such as by welding or gluing chassis brackets 203 to chassis base 100, or by using other fasteners like bolts. In this embodiment, chassis bracket rivets 206 are fastened through the sheet metal from the opposite side of chassis bracket 203 fold from the sheet metal with chassis bracket slots 204. In this manner, the sheet metal with chassis bracket slots 204 is oriented substantially perpendicular to the plane of chassis base 201.

In another embodiment, chassis brackets 203 and chassis base 201 are formed or manufactured from a unitary price of material. Accordingly, separate chassis brackets would not have to be attached to the chassis base. For example, a single piece of sheet metal may be stamped to form chassis bracket slots 204 and tabs 202. The edges of the sheet metal piece, having chassis slots 204, may then be bent to form chassis brackets 203 while the center of the sheet metal piece forms chassis base 201.

Figure 3A:
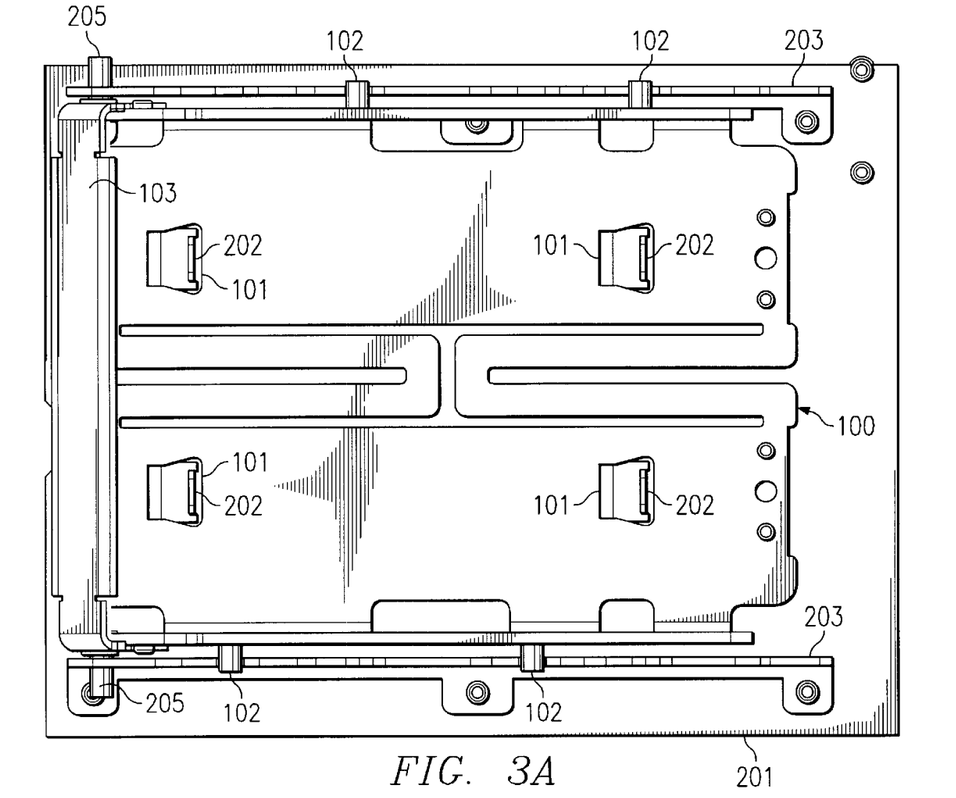
FIG. 3A is a top view of the mounting bracket of FIG. 1 lowered onto the chassis brackets of FIG. 2 in an unlocked position.
Figure 3B:
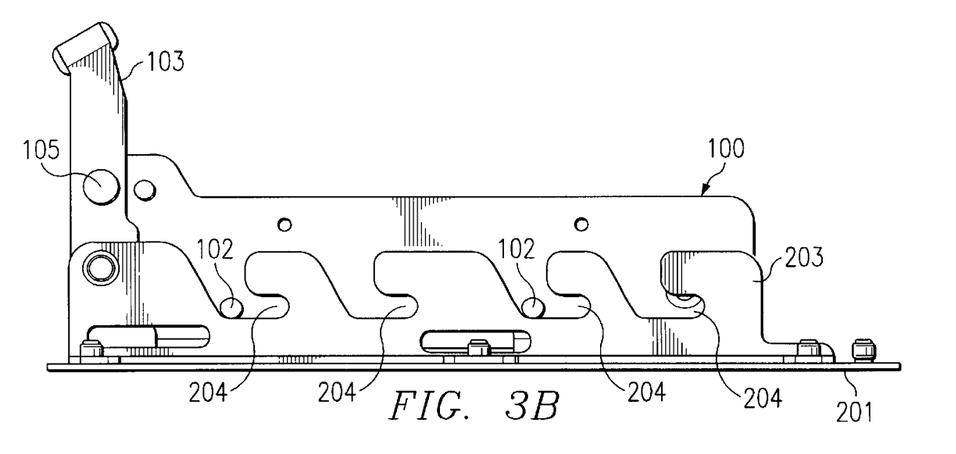
FIG. 3B is a profile view of the same configuration shown in FIG. 3A.

FIGS. 3A and 3B show mounting bracket assembly 100 in a seated and unlocked position on chassis brackets 203. FIG.

3A is a top view of bracket assembly, and shows four tabs 202 protruding upwardly through four tapered mounting bracket slots 101. Tabs 202 loosely fit within the tapered mounting bracket slots 101, said slots 101 allowing for lateral alignment of mounting bracket assembly 100 when tabs 202 are positioned in the wide portion of the tapered slots 101. Once the seating of mounting bracket assembly 100 begins, tabs 202 slide into the narrow portion of mounting bracket slots 101, providing a tight fit with minimal lateral movement. The narrow portion of mounting bracket slots 101 is laterally located such that mounting bracket assembly 100 is aligned when tabs 202 are positioned in the narrow portion of mounting bracket slots 100. One skilled in the art will realize that the shape of mounting bracket slots 101 can vary in other configurations, yet still provide for lateral mounting bracket assembly 100 movement in an unseated position and mounting bracket assembly 100 fixation in a seated position. In this configuration, engagement of mounting bracket slots 101 with tabs 202 also provides a positive stop to mounting bracket assembly 100 insertion.

FIG. 3B shows a profile view of mounting bracket assembly 100 in an unseated position on chassis brackets 203. Mounting bracket pegs 102 rest loosely within chassis bracket slots 204, allowing vertical movement of mounting bracket assembly 100. Once the seating of mounting bracket assembly 100 begins, mounting bracket pegs 102 will slide into the narrow portion of chassis bracket slots 204, restricting the vertical movement of mounting bracket assembly 100. One skilled in the art will realize that the shape of chassis bracket slots 204 can vary in other configurations, yet still provide for mounting bracket assembly 100 vertical movement in an unseated position and mounting bracket assembly 100 fixation in a seated position. In this configuration, engagement of mounting bracket pegs 102 with chassis bracket slots 204 also provides a positive stop to mounting bracket assembly 100 insertion.

Figure 3C:
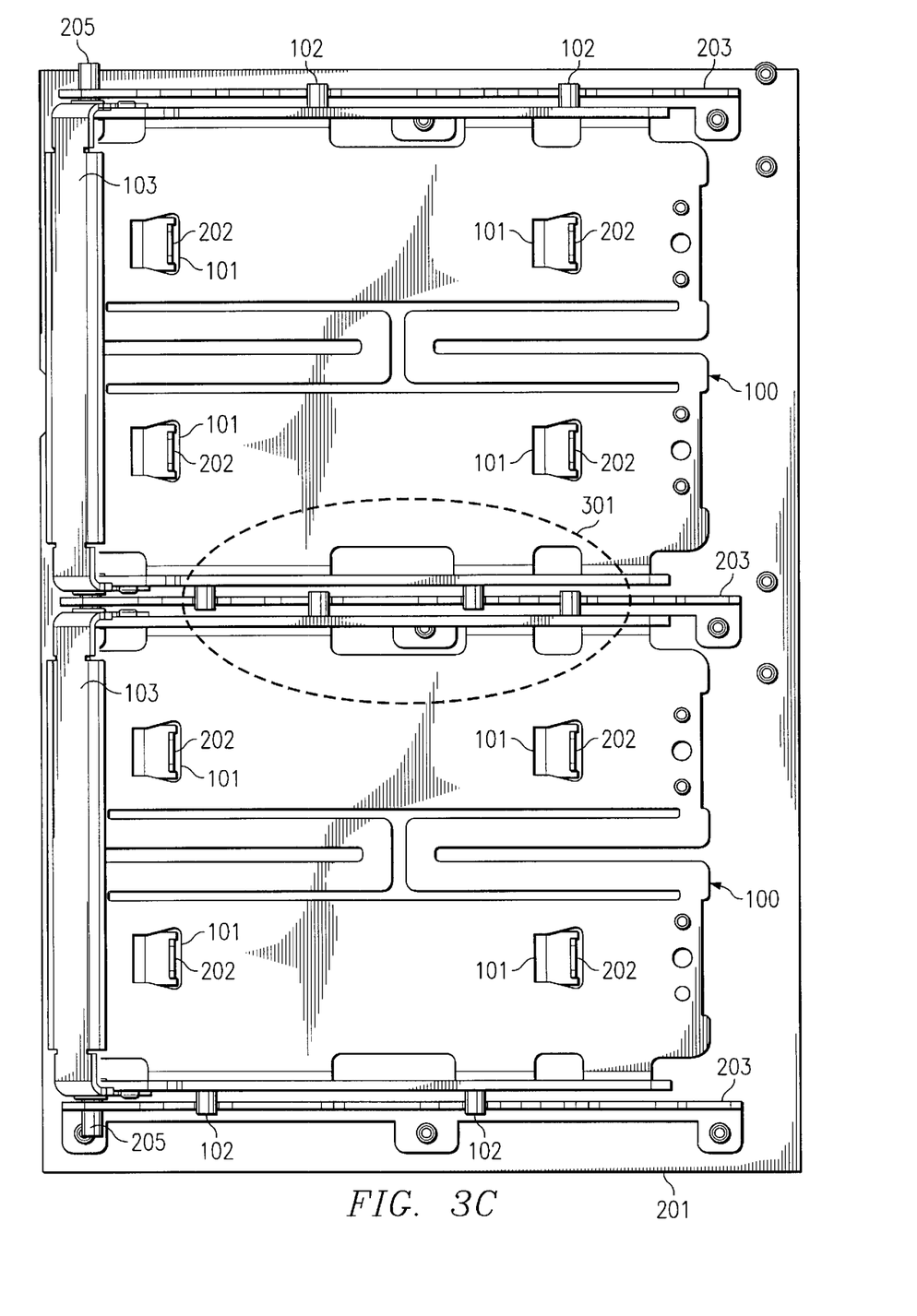
FIG. 3C is a top view of two devices mounted side by side using the mounting bracket.

FIG. 3C shows how two devices may be mounted side by side using three chassis brackets 203. An offset peg arrangement for multiple devices is shown in area 301.

Figure 4A:
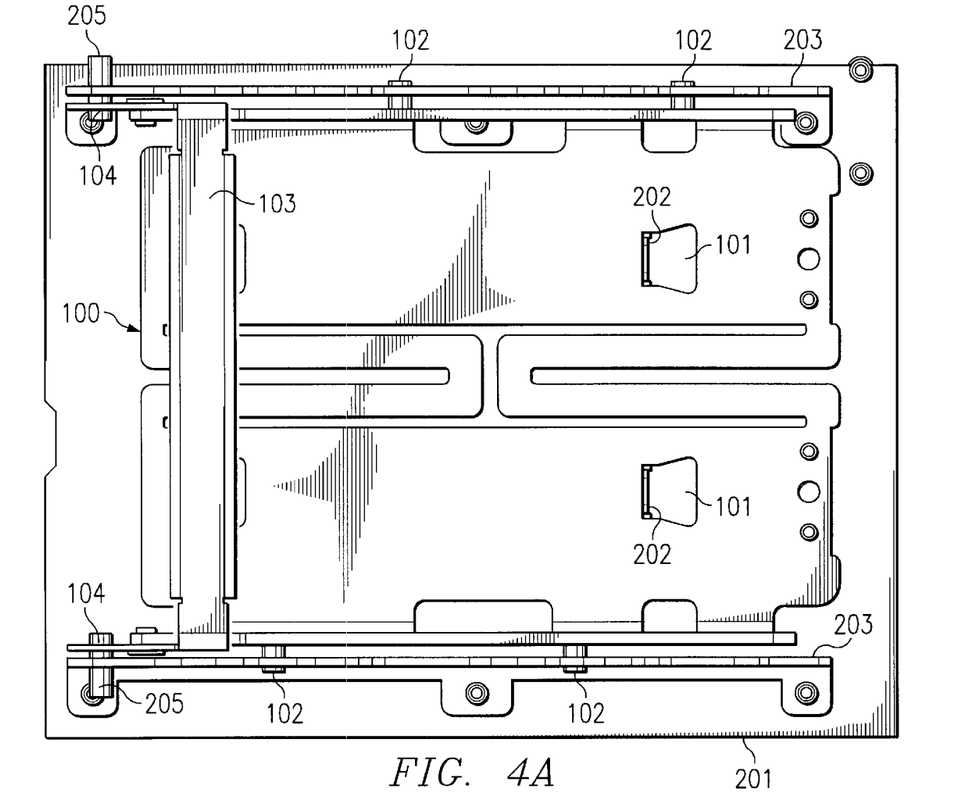
FIG. 4A is a top view of the mounting bracket of FIG. 1 lowered onto the chassis brackets of FIG. 2 in a locked position.
Figure 4B:
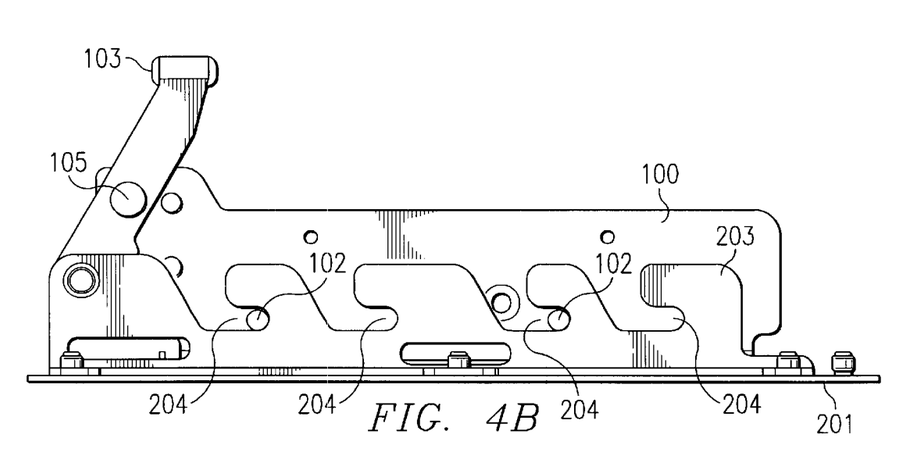
FIG. 4B is a profile view of the same configuration shown in FIG. 4A.

FIGS. 4A and 4B show mounting bracket assembly 100 in a seated and locked position on chassis brackets 203 in the preferred embodiment. FIG. 4A is a top view of the bracket assembly, and shows tabs 202 protruding upwardly through mounting bracket slots 101. In contrast to their position in FIG. 3A, tabs 202 now fit tightly within mounting bracket slots 101, restricting the lateral movement of mounting bracket assembly 100. Mounting bracket handle 103 has been forwardly rotated in the direction of mounting bracket assembly 100 insertion until a positive stop of mounting bracket assembly 100 insertion is achieved. Mounting bracket handle 103 has made contact with chassis bracket rotation pegs 205 moving mounting bracket assembly 100 in the direction of rotation. This movement of mounting bracket assembly 100 inserts tabs 202 into the narrow area of mounting bracket slots 101.

Figure 4C:
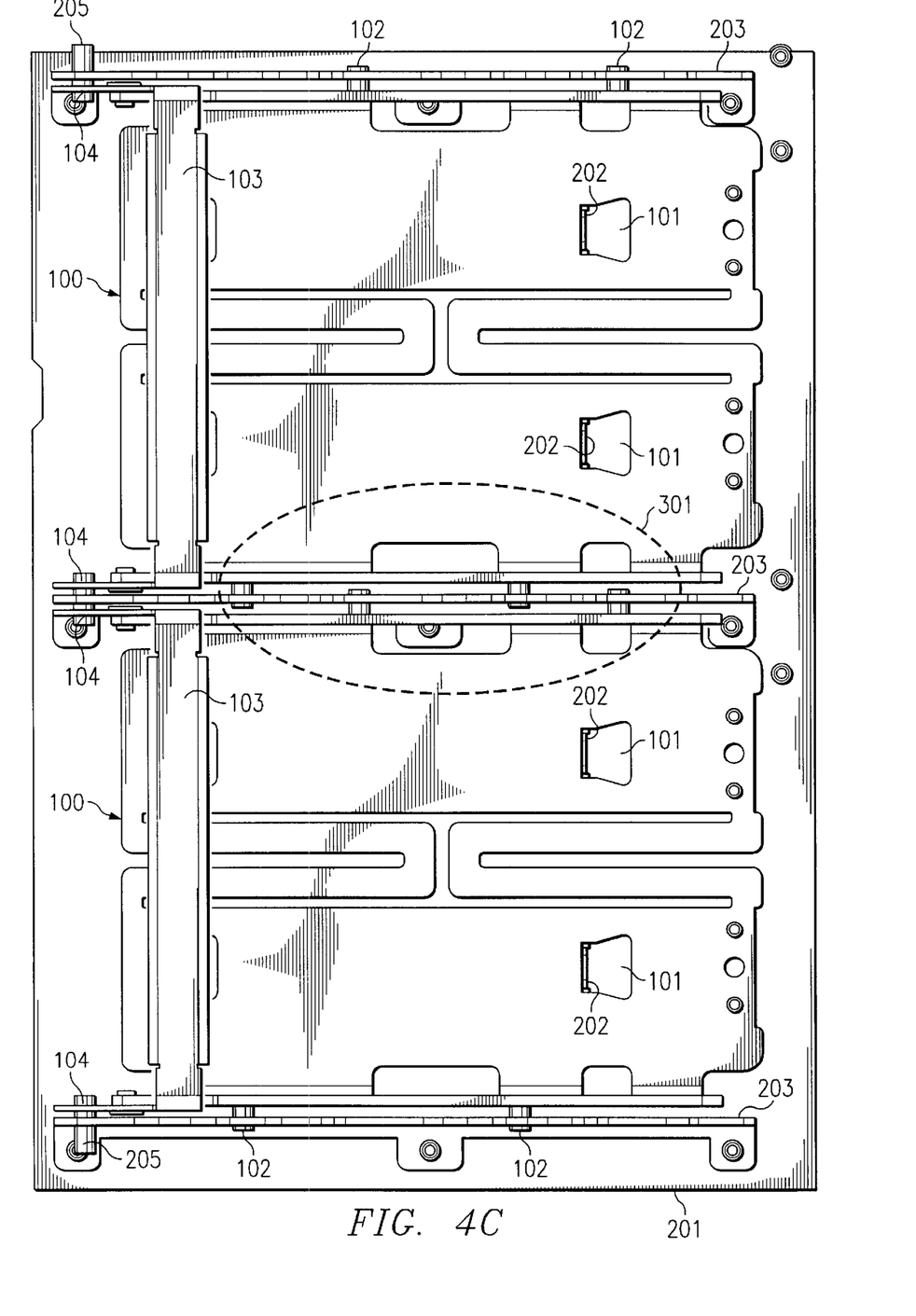
FIG. 4C is a top view of two devices mounted side by side using the mounting bracket.

The rotation of mounting bracket handle 103 also inserts mounting bracket pegs 102 into the narrow area of chassis bracket slots 204. In the preferred embodiment, mounting bracket pegs 102 are offset in the direction of mounting bracket assembly 100 insertion. The offset of mounting bracket pegs 102 allows positioning of multiple devices in a side by side arrangement while minimizing the amount of space required. FIGS. 3C and 4C show how the offset may be used to support the mounting of multiple devices. Although the preferred embodiment utilizes offset mounting bracket pegs 102, other embodiments may not use offset pegs.

FIG. 4B shows a profile schematic of mounting bracket assembly 100 seated in chassis brackets 203 in a preferred embodiment. Mounting bracket pegs 102 are preferably tightly fitted in chassis bracket slots 204 providing for minimal movement of mounting bracket assembly 100 once a positive stop of mounting bracket assembly 100 is achieved.

FIG. 4C shows how two devices may be mounted side by side using three chassis brackets 203. The offset pegs are depicted within area 301.

In each of the configurations shown a means to restrain or secure the handle in the closed position may be incorporated. The addition of this feature would ensure the device, such as a hard drive, would be retained in position and prevented from backing out of its mounting.

Note that, for ease of illustrations FIGS. 3A–C and FIGS. 4A–C are shown without a device installed. Note that the device may be attached to mount bracket assembly 100 by the use of screws, bolts or other positive means.

What is claimed is:

1. A bracket system for mounting a device bracket within a computer assembly comprising:
    a plurality of chassis brackets with slots, said chassis brackets attached to a chassis base of said computer assembly;
    a mounting bracket assembly with a plurality of tapered mounting bracket assembly slots, and a plurality of horizontally-protruding pegs, wherein said chassis brackets are positioned laterally to said mounting bracket assembly so that said mounting bracket pegs frictionally engage said chassis bracket slots when a mounting bracket handle functionally engages rotation pegs on said chassis bracket; and
    a plurality of tabs on said chassis base.

2. The bracket system of claim 1 wherein the mounting bracket assembly further comprises a handle engageable with rotation pegs on the chassis bracket.

3. The bracket system of claim 1 wherein engagement of said chassis bracket slots and said mounting bracket pegs provide a positive stop for said mounting bracket assembly.

4. The bracket system of claim 1 wherein engagement of said tabs and said mounting bracket assembly slots provide a positive stop for said mounting bracket assembly.

5. The bracket system of claim 1 wherein said mounting bracket assembly slots frictionally engage said tabs.

6. The bracket system of claim 1 wherein said chassis brackets are attached to said computer assembly with rivets.

7. The bracket system of claim 1 wherein said mounting bracket pegs are offset.

8. The bracket system of claim 1 wherein at least one of said chassis brackets supports two devices.

9. The bracket system of claim 1 wherein said mounting bracket assembly will frictionally engage said chassis bracket without a device present.

10. The bracket system of claim 1 wherein said mounting bracket assembly can be moved when said mounting bracket handle is not engaged with said chassis bracket rotation pegs, said mounting bracket assembly movement allowing said mounting bracket to be aligned.

11. A device mounting system, comprising:
    a chassis base including at least one vertical tab orientated in a lateral direction;
    a pair of parallel chassis brackets attached to said chassis base, each of said chassis brackets including at least one slotted opening in a vertical portion of said chassis brackets; and a mounting bracket assembly including a floor and a pair of opposing side walls, said floor including at least one tapered mounting bracket assembly slot that engages said vertical tab, each of said opposing side walls including at least one horizontally-protruding peg configured to engage said at least one slotted opening in said chassis bracket.

12. The mounting system according to claim 11 wherein engagement of said mounting bracket assembly and said chassis brackets provides a positive stop limiting slidable insertion of said mounting bracket assembly.

13. The mounting system according to claim 11 wherein said mounting bracket assembly has a plurality of mounting bracket slots through which a plurality of tabs may be inserted and frictionally engaged.

14. The mounting system according to claim 11 wherein said mounting bracket assembly has a handle that facilitates engagement of said mounting bracket assembly with said chassis brackets.

15. The mounting system according to claim 14 wherein said mounting bracket assembly handle engages rotation pegs on said chassis brackets to frictionally engage said mounting bracket assembly to said chassis brackets.

16. The mounting system of claim 11 wherein the chassis brackets are interchangeable.

17. The mounting system of claim 11 wherein said mounting bracket pegs are offset.

18. The mounting system of claim 17 wherein at least one of said chassis brackets support two devices.

* * * * *